(12) United States Patent
Peidous et al.

(10) Patent No.: US 11,534,819 B2
(45) Date of Patent: Dec. 27, 2022

(54) ELECTROMAGNETIC CASTING SYSTEMS INCLUDING FURNACES AND MOLDS FOR PRODUCING SILICON TUBES

(71) Applicant: LAM RESEARCH CORPORATION, Fremont, CA (US)

(72) Inventors: Igor Peidous, Liberty Township, OH (US); Vijay Nithiananthan, Eaton, OH (US)

(73) Assignee: Lam Research Corporation, Fremont, CA (US)

( * ) Notice: Subject to any disclaimer, the term of this patent is extended or adjusted under 35 U.S.C. 154(b) by 105 days.

(21) Appl. No.: 16/753,178

(22) PCT Filed: Oct. 2, 2018

(86) PCT No.: PCT/US2018/053956
§ 371 (c)(1),
(2) Date: Apr. 2, 2020

(87) PCT Pub. No.: WO2019/070699
PCT Pub. Date: Apr. 11, 2019

(65) Prior Publication Data
US 2020/0238370 A1 Jul. 30, 2020

Related U.S. Application Data

(60) Provisional application No. 62/568,526, filed on Oct. 5, 2017.

(51) Int. Cl.
*C30B 35/00* (2006.01)
*B22D 7/04* (2006.01)
(Continued)

(52) U.S. Cl.
CPC ............... *B22D 7/04* (2013.01); *B22D 7/064* (2013.01); *B22D 7/08* (2013.01); *B22D 27/02* (2013.01); *C30B 35/002* (2013.01)

(58) Field of Classification Search
CPC ....... C30B 15/00; C30B 15/002; C30B 15/02; C30B 15/10; C30B 15/12; C30B 15/14;
(Continued)

(56) References Cited

U.S. PATENT DOCUMENTS 4,915,723 A 4/1990 Kaneko et al.
6,027,563 A * 2/2000 Choudhury ............. C30B 29/06
117/214

(Continued)

FOREIGN PATENT DOCUMENTS

CN 101241845 A 8/2008
CN 102189246 A 9/2011
(Continued)

OTHER PUBLICATIONS

European Search Report issued in corresponding European Patent Application 18865244 dated Aug. 3, 2021 (8 pages).
(Continued)

*Primary Examiner* — Kenneth A Bratland, Jr.

(57) ABSTRACT

A furnace for electromagnetic casting a tubular-shaped silicon ingot is provided. The furnace includes a mold, outer and inner induction coils and a support member. The mold includes an outer crucible and an inner crucible. The outer crucible is annular-shaped. The inner crucible is disposed in the outer crucible and spaced away from the outer crucible to provide a gap between the inner crucible and the outer crucible. The mold is configured to receive granular silicon in the gap. The outer induction coil disposed around the outer crucible. The inner induction coil disposed in the inner crucible. The outer induction coil and the inner induction coil are configured to heat and melt the granular silicon in the mold to form a tubular-shaped silicon ingot. The support
(Continued)

member is configured to hold and move a seed relative to the mold during formation of the tubular-shaped silicon ingot on the seed.

25 Claims, 8 Drawing Sheets

(51) Int. Cl.
*B22D 7/06* (2006.01)
*B22D 7/08* (2006.01)
*B22D 27/02* (2006.01)

(58) Field of Classification Search
CPC ......... C30B 15/20; C30B 15/22; C30B 29/00; C30B 29/02; C30B 29/06; C30B 35/00; C30B 35/002; B22D 7/04; B22D 7/067; B22D 7/08; B22D 27/02
USPC .......... 117/11, 13–16, 23, 25, 200–202, 206, 117/208–210, 213–214, 217–218, 223, 117/928, 931–932
See application file for complete search history.

(56) References Cited

U.S. PATENT DOCUMENTS

| | | | | |
|---|---|---|---|---|
| 6,110,274 | A | * | 8/2000 | Okuno .................. C30B 11/003 83/217 |
| 9,553,221 | B2 | | 1/2017 | Maegawa et al. |
| 2005/0045593 | A1 | | 3/2005 | Ren et al. |
| 2005/0092236 | A1 | * | 5/2005 | Bender .................. C30B 15/22 117/200 |
| 2009/0044926 | A1 | | 2/2009 | Kida et al. |
| 2009/0084517 | A1 | | 4/2009 | Thomas et al. |
| 2009/0321996 | A1 | | 12/2009 | Kaneko |
| 2011/0214830 | A1 | * | 9/2011 | Holzgruber ............ B22D 23/10 164/250.1 |
| 2012/0236898 | A1 | * | 9/2012 | Keough .................. F27B 14/14 373/142 |
| 2012/0244061 | A1 | * | 9/2012 | Kaneko ................... C01B 33/02 65/355 |
| 2013/0255315 | A1 | * | 10/2013 | Maegawa ............... C30B 13/20 65/33.2 |

FOREIGN PATENT DOCUMENTS

| | | | |
|---|---|---|---|
| EP | 0349904 A2 | | 1/1990 |
| JP | 08229924 A | * | 9/1996 |
| JP | H08229924 A | | 9/1996 |

OTHER PUBLICATIONS

International Search Report and Written Opinion of the ISA issued in PCT/US2018/053956, dated Jan. 24, 2019; ISA/KR.

Office Action issued in corresponding Chinese Application No. 201880065151.1 dated May 7, 2021 (12 pages).

* cited by examiner

ELECTROMAGNETIC CASTING SYSTEMS INCLUDING FURNACES AND MOLDS FOR PRODUCING SILICON TUBES

CROSS-REFERENCE TO RELATED APPLICATIONS

This application is a 371 U.S. National Phase of International Application No. PCT/US2018/053956, filed on Oct. 2, 2018, which claims the benefit of U.S. Provisional Application No. 62/568,526, filed on Oct. 5, 2017. The entire disclosures of the applications referenced above are incorporated herein by reference.

FIELD

The present disclosure relates to electromagnetic casting of silicon ingots.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An electromagnetic casting system for casting a silicon ingot can include a furnace. The furnace typically includes a mold, an induction coil, and one or more heaters. The mold is a cylindrically-shaped crucible with open ends. One of the open ends serves as an inlet for receiving grains of polycrystalline silicon (hereinafter referred to as "silicon") and the other open end serves as an outlet for a silicon crystal (or formed ingot). The induction coil surrounds the mold and is used to melt the granular silicon entering the mold. The molten silicon begins to cool in the mold to form a solidified silicon ingot. The one or more heaters are disposed below the mold and are used, such that the silicon ingot cools at a slow rate for proper curing.

SUMMARY

A furnace for electromagnetic casting a tubular-shaped silicon ingot is provided. The furnace includes a mold, an outer induction coil, an inner induction coil, and a support member. The mold includes an outer crucible and an inner crucible. The outer crucible is annular-shaped. The inner crucible is disposed in the outer crucible and spaced away from the outer crucible to provide a gap between the inner crucible and the outer crucible. The mold is configured to receive granular silicon in the gap. The outer induction coil disposed around the outer crucible. The inner induction coil disposed in the inner crucible. The outer induction coil and the inner induction coil are configured to heat and melt the granular silicon in the mold to form a tubular-shaped silicon ingot. The support member is configured to hold and move a seed relative to the mold during formation of the tubular-shaped silicon ingot on the seed.

In other features, the furnace further includes heaters configured to heat the tubular-shaped silicon ingot subsequent to being pulled from the mold. In other features, the furnace further includes hoppers and feeders. The feeders supply the granular silicon and a dopant to the plurality of hoppers. The hoppers guide the granular silicon and the dopant into the gap in the mold. The outer crucible is funnel-shaped to guide the granular silicon and the dopant from the hoppers into the gap in the mold.

In other features, the inner crucible is formed of plates placed in a circle to provide a circular side wall. In other features, the plates are spaced apart to allow the plates to deflect while experiencing contraction forces on the plates by the tubular-shaped silicon ingot during cooling of the tubular-shaped silicon ingot. In other features, the plates include coolant channels configured to receive a coolant to cool the inner crucible.

In other features, the inner crucible has a closed bottom end. In other features, the inner crucible has an open bottom end. In other features, the inner crucible extends below a bottom of the outer crucible. In other features, a sidewall of the inner crucible is tapered, such that a first lower outer diameter of the inner crucible is less than an upper outer diameter of the inner crucible.

In other features, an electromagnetic casting system is provided and includes the furnace, at least one sensor and a control module. The at least one sensor detects at least one parameter of the furnace. The control module is configured to, based on the at least one parameter, control a pull rate of the support member away from the mold. In other features, the control module is configured to, based on the at least one parameter, control (i) flow of the granular silicon into the mold, and (ii) current to the outer induction coil and the inner induction coil.

In other features, a mold for forming a tubular-shaped silicon ingot is provided. The mold includes an outer crucible and an inner crucible. The outer crucible is annular-shaped. The inner crucible is disposed in the outer crucible, such that the outer crucible surrounds the inner crucible. A gap exists between the outer crucible and the inner crucible. The outer crucible and the inner crucible are configured to receive granular silicon in the gap. The inner crucible includes plates. The plates include inner surfaces, sides, and outer surfaces. The inner surfaces face each other and are disposed along an inner circular perimeter. The plates are disposed to provide a tubular-shaped structure. The plates are disposed, such that gaps exist between adjacent ones of the sides for displacement of the plates radially inward while experiencing contraction forces of the tubular-shaped silicon ingot on the outer surfaces during solidification of the tubular-shaped silicon ingot.

In other features, the outer surfaces are disposed along an outer circular perimeter of the inner crucible. In other features, the gaps between the plates exist for a bottom portion of the inner crucible and do not exist for an upper portion of the inner crucible. In other features, the inner crucible has a closed bottom end. In other features, the inner crucible has an open bottom end. In other features, the inner crucible extends below a bottom of the outer crucible. In other features, the inner crucible comprises coolant channels for receiving a coolant to cool the inner crucible.

In other features, an electromagnetic casting system is provided and includes the mold, a first sensor for detecting a first parameter of the mold, and a control module configured to, based on the first parameter, control temperature and flow of coolant to the inner crucible. In other features, the electromagnetic casting system includes: an outer induction coil surrounding the outer crucible; an inner induction coil disposed in the inner crucible; a support member configured to hold a seed; and a second sensor configured to detect a second parameter. The control module is configured to, based on the first parameter and the second parameter, control (i) a pull rate of the support member away from the mold, (ii) flow of the granular silicon into the mold, and (ii) current to the outer induction coil and the inner induction coil.

In other features, a method of forming a tubular-shaped silicon ingot via a mold is provided, where: the mold includes an outer crucible and an inner crucible; the outer crucible is annular-shaped; and the inner crucible is disposed in the outer crucible and spaced away from the outer crucible to provide a gap between the inner crucible and the outer crucible. The method includes: setting an ingot seed on a support member; powering an inner induction coil and an outer induction coil to melt a top portion of the ingot seed, where the outer induction coil is disposed around the outer crucible, and where the inner induction coil is disposed in the inner crucible; and providing granular silicon and a dopant in the gap of the mold. The method further includes starting crystal silicon growth on the ingot seed including (i) controlling current to the inner induction coil and the outer induction coil to heat and melt the granular silicon in the mold, and (ii) pulling down the support member relative to the mold while controlling temperature and flow rate of coolant to the inner crucible. The outer induction coil and the inner induction coil are configured to heat and melt the granular silicon in the mold to form the tubular-shaped silicon ingot.

In other features, the method further includes: determining whether the tubular-shaped silicon ingot is at a predetermined length; and if the tubular-shaped silicon ingot is at the predetermined length, maintaining the tubular-shaped silicon ingot in a predetermined temperature range for a predetermined period of time. In other features, the method includes melting the granular silicon and forming a portion of the tubular-shaped silicon ingot at a closed bottom end of the inner crucible. In other features, the method includes melting the granular silicon and forming a portion of the tubular-shaped silicon ingot at an open bottom end of the inner crucible. In other features, the method includes melting the granular silicon and forming a portion of the tubular-shaped silicon ingot at a tapered bottom portion of the inner crucible. In other features, the method includes melting the granular silicon and forming the portion of the tubular-shaped silicon ingot at non-tapered bottom portion of the outer crucible.

In other features, the starting of the crystal silicon growth on the ingot seed includes pulling down the support member relative to the mold while controlling temperature and flow rate of coolant to plates of the inner crucible. In other features, the method further includes circulating the coolant through channels in the plates. In other features, the method further includes controlling current to the inner induction coil and the outer induction coil to control curvature of a solidification interface between molten silicon and the tubular-shaped silicon ingot, wherein the heated and melted granular silicon in the mold includes the molten silicon.

In other features, the method further includes: cooling the tubular-shaped silicon ingot; and permitting plates of the inner crucible to shift relative to each other while the tubular-shaped silicon ingot cools. In other features, a tubular-shaped silicon ingot is formed using the stated method, where: an outer surface of the tubular-shaped silicon ingot is defined by an inner surface of the outer crucible; and an inner surface of the tubular-shaped silicon ingot is defined by an outer surface of the inner crucible. In other features, uniformity of grain structures of the tubular-shaped silicon ingot is based on the heating of the granular silicon in the mold via the inner induction coil and the outer induction coil.

In other features, a method of forming a product is provided. The method of forming the product includes: the method of forming a tubular-shaped silicon ingot; and slicing the tubular-shaped silicon ingot to provide the product. In other features, a ring for an etching chamber is provided. The ring is formed according to the method of forming a product. The tubular-shaped silicon ingot is cut to provide a plurality of slices. One of the slices is machined to provide the ring.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

An etching chamber for etching semiconductor substrates may include electrodes and confinement rings. The electrodes and confinement rings may be formed of silicon. The electrodes, confinement rings and other annular-shaped manufactured parts may be formed from a cylindrically-shaped silicon ingot. However, this involves at least forming the silicon ingot, slicing the silicon ingot, and precisely machining holes in centers of the slices to provide the rings. This manufacturing process is time consuming and costly.

To simplify this process, examples are set forth herein that include furnace casting silicon tubes, which may then be sliced to provide silicon rings. Electromagnetic casting is performed to provide silicon tubes that are near-net-shape of parts used in various types of equipment, such as equipment of an etching chamber.

Figure 1:
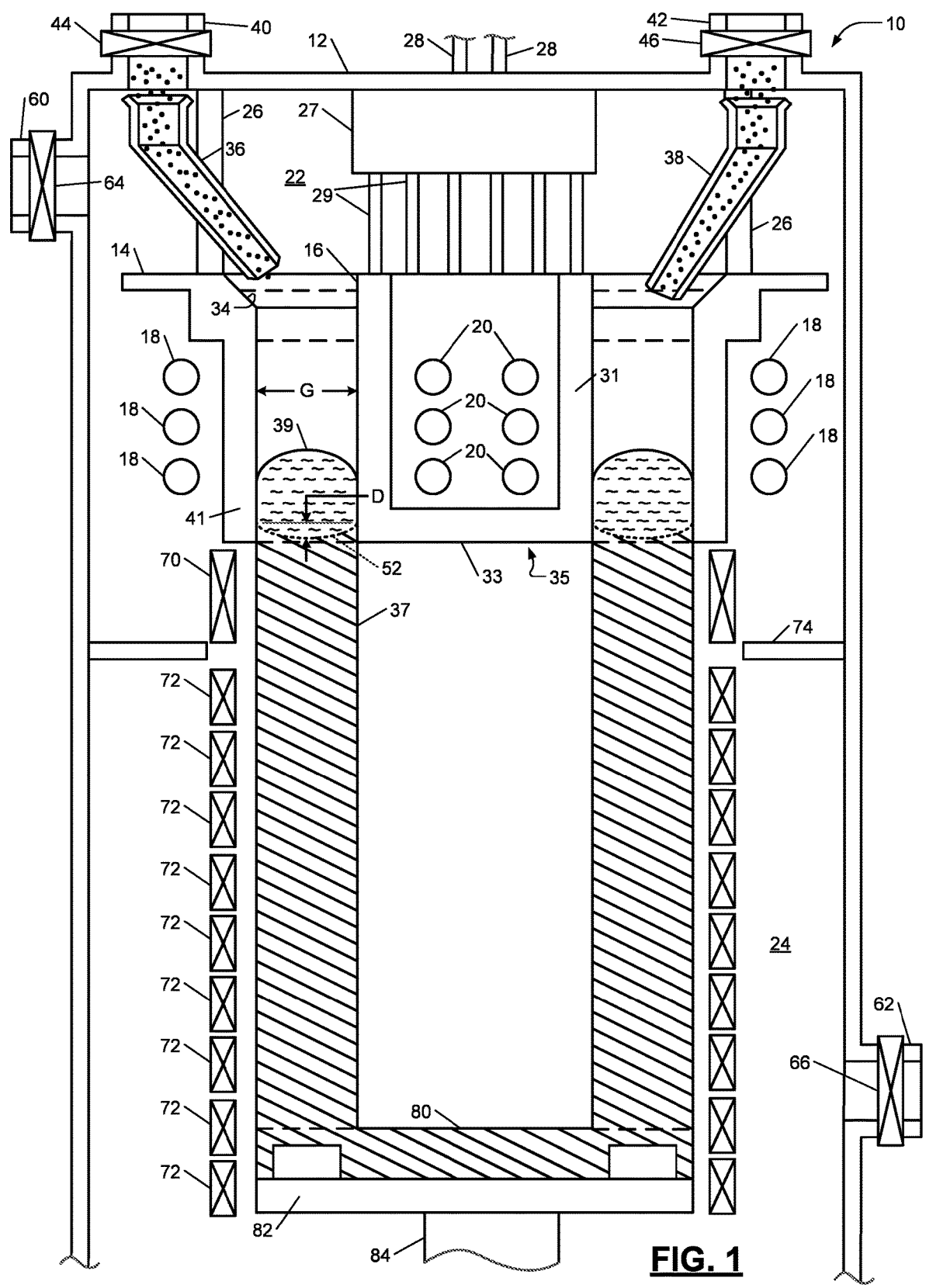
FIG. 1 is a side cross-sectional view of an example of a portion of an ingot casting system including an electromagnetic casting furnace having a closed inner crucible in accordance with an embodiment of the present disclosure.
Figure 6:
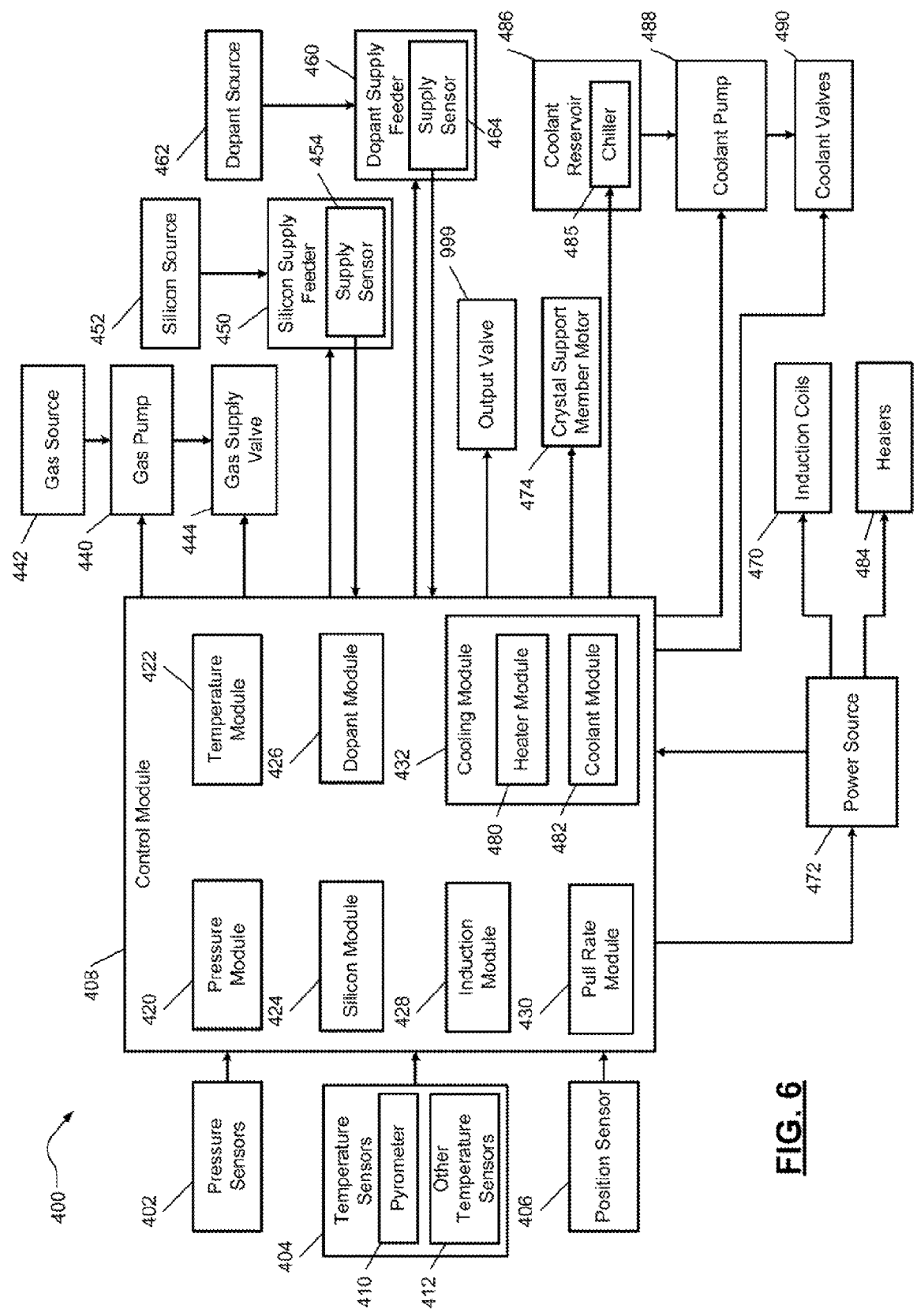
FIG. 6 is a functional block diagram of an example of a portion of an ingot casting system including a control system in accordance with an embodiment of the present disclosure.

FIG. 1 shows a portion of an ingot casting system that includes an electromagnetic casting (EMC) furnace 10. In addition to the EMC furnace 10, the ingot casting system may also include a control system, an example of which is shown in FIG. 6. The EMC furnace 10 may include a chamber 12, an outer crucible 14, an inner crucible 16, an outer induction coil (represented by circles 18) and an inner induction coil (represented by circles 20). The chamber 12 may be divided into two areas 22, 24. The crucibles 14, 16 (also referred to as "the mold") are disposed in the first area 22 and are used to form tubular-shaped silicon tubes. The outer crucible 14 is tubular-shaped and may be suspended from a top of the chamber 12 via support members 26. The outer crucible 14 surrounds the inner crucible 16. The inner crucible 16 may be suspended from a top of the chamber 12 via a support structure. In the example, shown the support structure includes (i) a cylindrical manifold 27 that may receive coolant from supply and return lines 28, and (ii) supply and return lines 29. The inner crucible 16 is connected to the supply and return lines 29, which are connected to the cylindrical manifold 27. The cylindrical manifold 27 is connected to the top of the chamber 12.

The inner crucible 16 is cup-shaped and holds the inner induction coil 20. The inner crucible 16 includes a sidewall 31 and a bottom wall 33. A bottom end 35 of the inner crucible 16 is closed via the bottom wall 33. This limits the amount of heat directly passing from the induction coil 20 to a tubular-shaped crystal 37 being formed. The closed bottom end 35 also prevents a molten mixture 39 from reaching the inner induction coil 20. In an embodiment, the sidewall 31 does not extend below a bottom of a sidewall 41 of the outer crucible 14.

The sidewalls 31, 41 are formed of one or more materials that have a melting point above at least a first predetermined level and a thermal conductivity valve greater than at least a second predetermined level while minimizing contaminating the molten mixture 39 and crystal 37. The sidewalls 31, 41 may be formed of copper, nickel, silver, a refractory metals (e.g., tungsten and/or molybdenum), and/or other suitable materials. In an example embodiment, the melting point of the materials forming the sidewalls 31, 41 is higher than the melting point of the materials provided to create the molten mixture 39. As an example, the materials may be selected to minimize an amount of copper included in the sidewalls 31, 41 to minimize copper contamination of the crystal 37. In one embodiment, the sidewalls 31, 41 include respective cores and outer layers. The outer layers may surround the cores. The cores include copper and the outer layers, which have less than a predetermined amount of copper or no copper. In another embodiment, an outer layer of the sidewall 31 and an inner layer of the sidewall 41 facing the molten mixture 39 and the crystal 37 have less than a predetermined amount of copper or no copper.

An upper inner portion 34 of the outer crucible 14 may be funnel-shaped to guide materials from the hoppers 36, 38. During operation, raw materials are supplied to the hoppers 36, 38 through inlet channels 40, 42 via valves 44, 46. As an example, the hopper 36 may receive a dopant powder (e.g., Boron) and the hopper 38 may receive granular polysilicon. The materials are dropped into an annular-shaped gap G between the outer crucible 14 and the inner crucible 16. The materials are then melted from heat generated by the induction coils 18, 20 to provide the molten mixture 39, which cools to form a portion of the crystal prior to exiting the crucibles 14, 16. The outer induction coil 18 surrounds and/or is coiled around the outer crucible 14 and heats an outer circumferential portion of the supplied materials/molten mixture 39. The inner induction coil 20 heats an inner circumferential portion of the supplied materials/molten mixture 39. The induction coils 18, 20 may also heat an end portion of the crystal 37 nearest the crucibles 14, 16.

The inner induction coil 20 may be controlled to control temperature distributions within the crystal 37 and create the solidification interface 52 between the molten mixture 39 and the crystal 37. The solidification interface 52 is an interface between a liquid (i.e. the molten mixture 39) and a solid (i.e. the crystal 37). The solidification interface 52 is flatter (i.e. more linear) than if the inner induction coil 220 were not used. The solidification interface 52 would be more cup-shaped or rounded if the inner induction coil 20 was not used. The flatter solidification interface 52 improves uniformity of the grain structure of the crystal 37. Molten silicon solidifies in grains, which tend to grow in a direction perpendicular to a solidification front. Therefore, the size and orientation of the grains in an ingot is based on the curvature or bow of the solidification interface. The disclosed furnace implementations of FIGS. 1-3 reduce bow curvature of solidification fronts, which increases uniformity of grain sizes of the formed ingots. The less bow curvature, the less the depth (or vertical radius of curvature) of a molten mixture at a center of a solidification front. An example depth D is shown in FIG. 1. Grain size uniformity improves uniformity of mechanical properties of the ingots and reduces process variability and mechanical defect formation during material shaping, which improves machining yield. Grain size uniformity also improves uniformity of chemical properties of the ingots. As a result, components machined from the ingots have a uniform and controllable response to chemical and plasma surface impacts. This controllability improves reliability of equipment that includes the manufactured components.

The chamber 12 may further include a gas inlet 60, a gas outlet 62, and corresponding gas inlet (or supply) and gas outlet valves 64, 66 through which a supply gas, a purge gas, and other gases may pass. The chamber 12 may further include a first heater 70 in the first area 22 and heaters 72 in the second area 24. The heaters 72 are disposed in a row along the crystal 37 from a wall 74 separating the areas 22, 24 to a lower end of the chamber 12 and/or area 24. The heaters 72 surround the crystal 37, a seed 80 and a crystal support member 82. The heater 70 is used to control a crystallization rate of the crystal 37. The heaters 70, 72 are used to control cooling of the crystal 37 to prevent cracking of the crystal 37. Prior to forming the crystal 37, the seed 80 is placed on the crystal support member 82 and the crystal support member 82 is moved via a shaft 84 vertically to the crucibles 14, 16. As the crystal 37 is formed on the seed 80, the crystal support member 82 is pulled downward along the heaters 70, 72. Heat extraction below the crucibles 14, 16 is simplified because a ratio of a mass of the crystal 37 to a surface area of the solidification interface 52 is reduced as compared to a ratio of a mass of a traditional cylindrically-shaped ingot to a surface area of a corresponding solidification interface. The reduced ratio is associated with reduced intrinsic stresses in cast silicon ingots and improves yield of manufactured and machined components from the cast silicon ingots.

Figure 2:
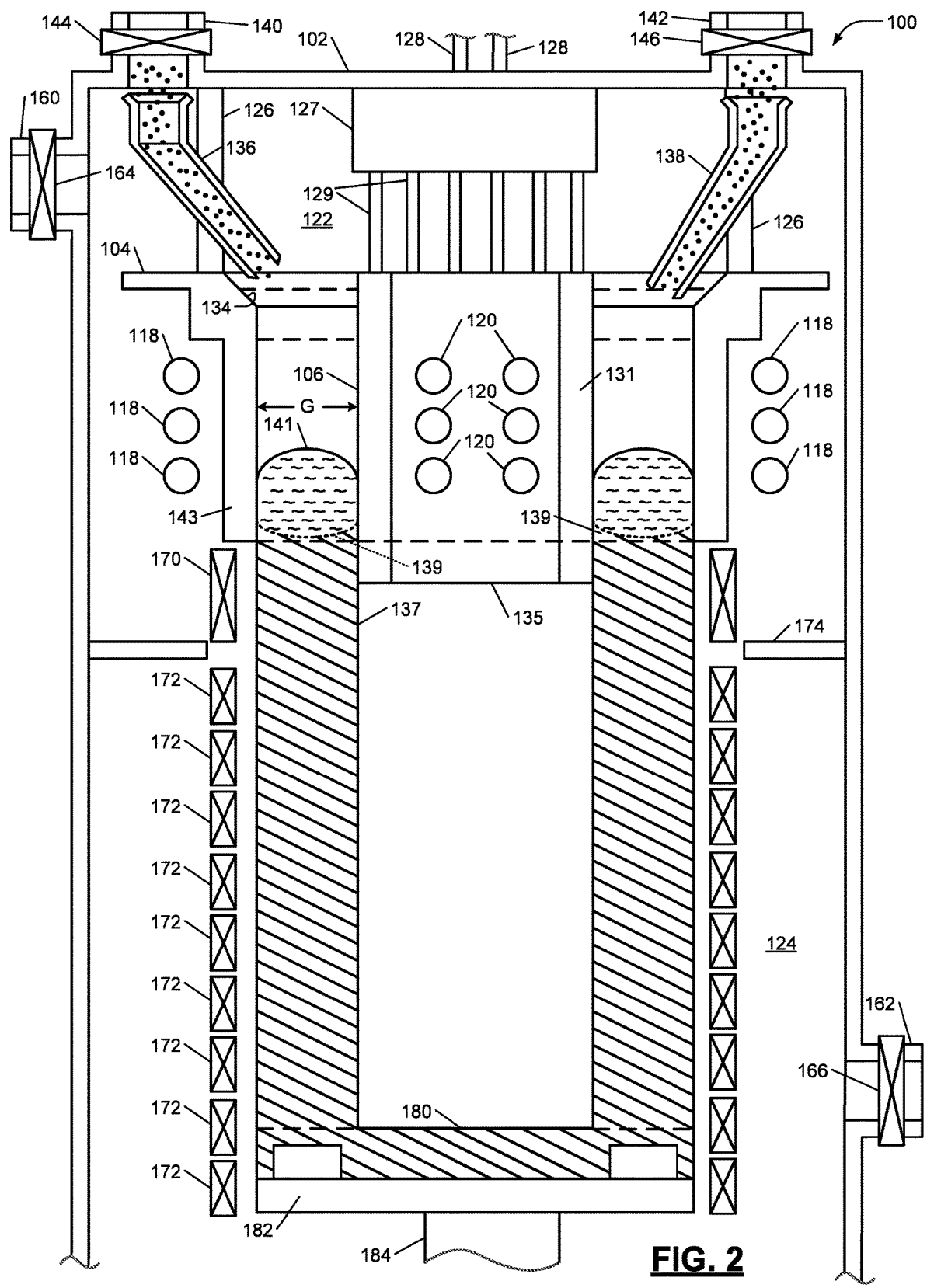
FIG. 2 is a side cross-sectional view of an example of a portion of another ingot casting system including an electromagnetic casting furnace having an open ended inner crucible in accordance with an embodiment of the present disclosure.

FIG. 2 shows a portion of an ingot casting system including an EMC furnace 100. In addition to the EMC furnace 100, the ingot casting system may also include a control system, an example of which is shown in FIG. 6. The EMC furnace 100 may include a chamber 102, an outer crucible 104, an inner crucible 106 that is open ended, an outer induction coil (represented by circles 118) and an inner induction coil (represented by circles 120). The chamber 102 may be divided into two areas 122, 124. The crucibles 104, 106 (also referred to as "the mold") are disposed in the first area 122 and are used to form tubular-shaped silicon tubes. The outer crucible 104 is tubular-shaped and may be suspended from a top of the chamber 102 via support members 126. The outer crucible 104 surrounds the inner crucible 106. The inner crucible 106 may be suspended from a top of the chamber 102 via a support structure. In the example, shown the support structure includes (i) a cylindrical manifold 127 that may receive coolant from supply and return lines 128, and (ii) supply and return lines 129. The inner crucible 106 is connected to the supply and return lines 129, which are connected to the cylindrical manifold 127. The cylindrical manifold 127 is connected to the top of the chamber 102.

The inner crucible 106 is tubular-shaped and holds the inner induction coil 120. The inner crucible 106 includes a sidewall 131. The sidewall 131 is extended, as opposed to the sidewall 31 of FIG. 1, and has a bottom end 135 that is open. By having an open ended sidewall 131, heat may be directly passed from the inner induction coil 120 to a tubular-shaped crystal 137 being formed. The increased length of the sidewall 131, however limits the amount of heat directly passing from the inner induction coil 120 to a solidification interface 139 and a portion 139 of the crystal 137 between the crucibles 104, 106. The increased length also prevents a molten mixture 141 from reaching the inner induction coil 120. Unlike the sidewall 31 of FIG. 1, the sidewall 131 extends below a wall 143 of the outer crucible 104.

The sidewalls 131, 143 are formed of one or more materials that have a melting point above at least a first predetermined level and a thermal conductivity valve greater than at least a second predetermined level while minimizing contaminating the molten mixture 141 and crystal 137. The sidewalls 131, 143 may be formed of copper, nickel, silver, a refractory metals (e.g., tungsten and/or molibdenum), and/or other suitable materials. The melting point of the sidewalls 31, 41 is higher than the melting point of the materials provided to create the molten mixture 39. As an example, the materials may be selected to minimize an amount of copper included in the sidewalls 131, 143 to minimize copper contamination of the crystal 137. In one embodiment, the sidewalls 131, 143 include respective cores and outer layers. The outer layers may surround the cores. The cores include copper and the outer layers have less than a predetermined amount of copper or no copper. In another embodiment, an outer layer of the sidewall 131 and an inner layer of the sidewall 143 facing the molten mixture 141 and the crystal 137 have less than a predetermined amount of copper or no copper.

An upper inner portion 134 of the outer crucible 104 may be funnel-shaped to guide materials from the hoppers 136, 138. During operation, raw materials are supplied to the hoppers 136, 138 through inlet channels 140, 142 via valves 144, 146. As an example, the hopper 136 may receive a dopant powder (e.g., Boron) and the hopper 138 may receive granular polysilicon. The materials are dropped into an annular-shaped gap G between the outer crucible 104 and the inner crucible 106. The materials are then melted from heat generated by the induction coils 118, 120 to provide the molten mixture 141, which cools to form a portion of the crystal prior to exiting the crucibles 104, 106. The outer induction coil 118 surrounds and/or is coiled around the outer crucible 104 and heats an outer circumferential portion of the supplied materials/molten mixture 141. The inner induction coil 120 heats an inner circumferential portion of the supplied materials/molten mixture 141. The induction coils 118, 120 may also heat an end portion of the crystal 137 nearest the crucibles 104, 106. The inner induction coil 120 may be controlled to control temperature distributions within the crystal 137 and create the solidification interface 139 between the molten mixture 141 and the crystal 137. The solidification interface 139 is flatter than if the inner induction coil 120 were not used.

The chamber 102 may further include a gas inlet 160, a gas outlet 162, and corresponding gas inlet (or supply) and gas outlet valves 164, 166 through which a supply gas, a purge gas, and other gases may pass. The chamber 102 may further include a first heater 170 in the first area 122 and heaters 172 in the second area 124. The heater 170 surrounds a portion of the crystal 137 in the first area 122. The heaters 172 are disposed in a row along the crystal 137 from a wall 174 separating the areas 122, 124 to a lower end of the chamber 102 and/or area 124. The heaters 172 surround the crystal 137, a seed 180 and a crystal support member 182. The heater 170 is used to control a crystallization rate of the crystal 137. The heaters 170, 172 are used to control cooling of the crystal 137. Prior to forming the crystal 137, the seed 180 is placed on the crystal support member 182 and the crystal support member 182 is moved via a shaft 184 vertically to the crucibles 104, 106. As the crystal 137 is formed on the seed 180, the crystal support member 182 is pulled downward along the heaters 170, 172. Heat extraction below the crucibles 104, 106 is simplified because a ratio of a mass of the crystal 137 to a surface area of the solidification interface 139 is reduced as compared to a ratio of a mass of a traditional cylindrically-shaped ingot to a surface area of a corresponding solidification interface. The reduced ratio is associated with reduced intrinsic stresses in cast silicon ingots and improves yield of manufactured and machined components from the cast silicon ingots.

Figure 3:
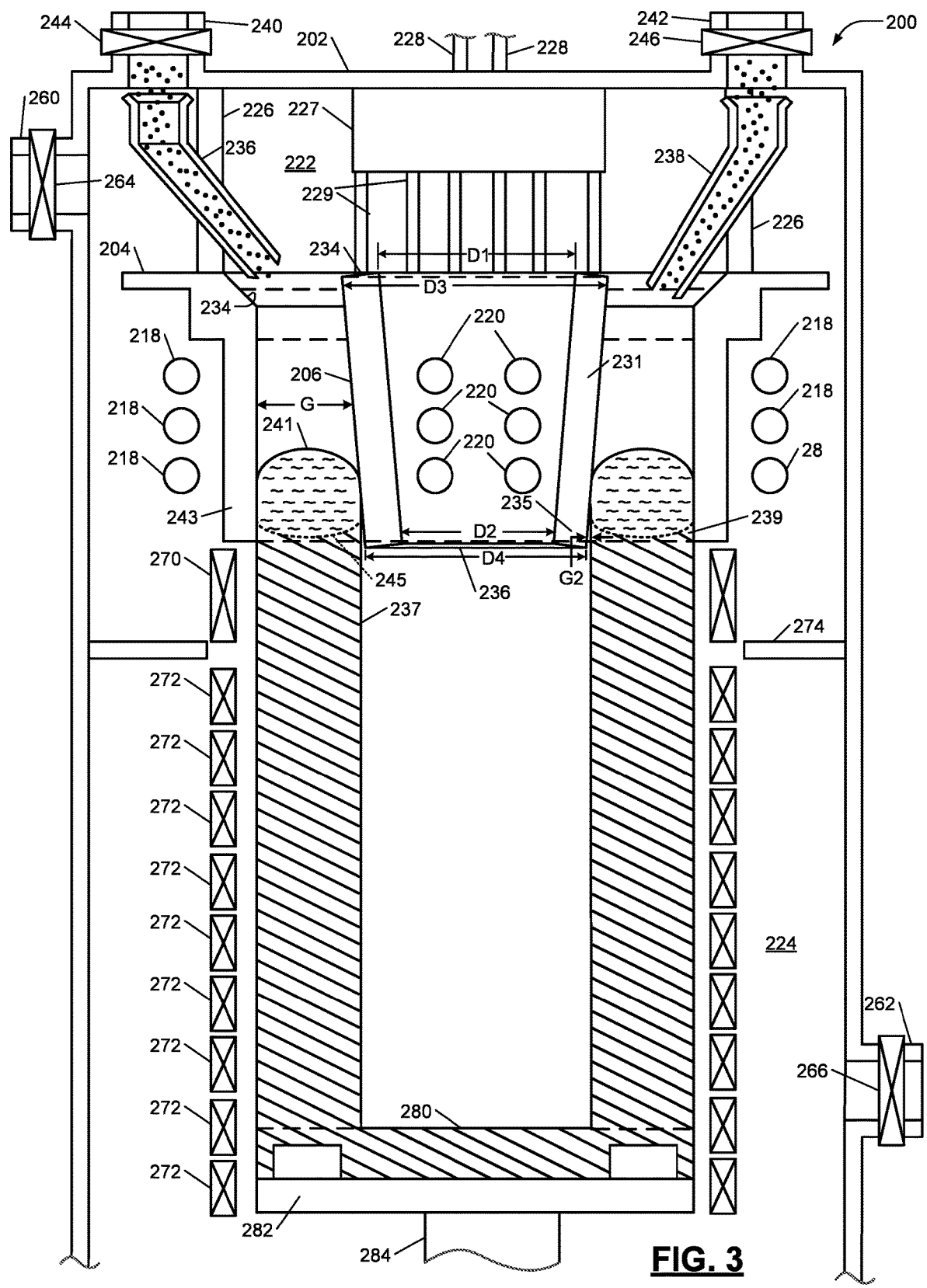
FIG. 3 is a side cross-sectional view of an example of a portion of another ingot casting system including an electromagnetic casting furnace having a tapered and open inner crucible in accordance with an embodiment of the present disclosure.

FIG. 3 shows a portion of an ingot casting system including an EMC furnace 200. In addition to the EMC furnace 200, the ingot casting system may also include a control system, an example of which is shown in FIG. 6. The EMC furnace 200 may include a chamber 202, an outer crucible 204, a tapered and open inner crucible 206, an outer induction coil (represented by circles 218) and an inner induction coil (represented by circles 220). The chamber 202 may be divided into two areas 222, 224. The crucibles 204, 206 (also referred to as "the mold") are disposed in the first area 222 and are used to form tubular-shaped silicon tubes. The outer crucible 204 is tubular-shaped and may be suspended from a top of the chamber 202 via support members 226. The outer crucible 204 surrounds the inner crucible 206. The inner crucible 206 may be suspended from a top of the chamber 202 via a support structure. In the example, shown the support structure includes (i) a cylindrical manifold 227 that may receive coolant from supply and return lines 228, and (ii) supply and return lines 229. The inner crucible 206 is connected to the supply and return lines 229, which are connected to the cylindrical manifold 227. The cylindrical manifold 227 is connected to the top of the chamber 202.

The inner crucible 206 is conical-shaped and holds the inner induction coil 220. The inner crucible 206 includes a sidewall 231. The sidewall 231 is tapered, such that an upper inner diameter D1 is greater than a lower inner diameter D2 and an upper outer diameter D3 is greater than a lower outer diameter D4. The inner diameter of the sidewall 231 decreases from a top end 234 to a bottom end 236 of the sidewall 231. The bottom end 236 is an open end. The inner crucible 206 is tapered towards the bottom end 236, where the ingot is solidified and pulled from the crucibles 204, 206. By having an open ended sidewall 231, heat may be directly passed from the inner induction coil 220 to a tubular-shaped crystal 237 being formed. The tapered sidewall 231, however limits the amount of heat directly passing from the inner induction coil 220 to a solidification interface 245 and a portion 239 of the crystal 237 between the crucibles 204, 206. The tapered sidewall 231 also prevents a molten mixture 241 from reaching the inner induction coil 220. Also, by having the sidewall 231 tapered, the crystal 237 is able to contract when solidifying below the solidification interface 245. Since the sidewall 231 is tapered a gap G2 exists between the bottom portion 235 of the sidewall 231 and the crystal 237. This provides space for the crystal 237 to contract, while minimizing frictional forces in a radial direction between the crystal 237 and the bottom portion 235 of the sidewall 231. This prevents mechanical damage of the crystal 237. The gap G2 between (i) the bottom portion 235 and (ii) the molten mixture 241 and the crystal 237, is tapered with the widest portion at the bottom end 236 and the narrowest portion where the sidewall 231 contacts the molten mixture 241. The sizes of the gap G2 may be set to minimize pressure on the bottom portion of the inner crucible 206 during solidification of the crystal 237.

The sidewalls 231, 243 are formed of one or more materials that have a melting point above at least a first predetermined level and a thermal conductivity valve greater than at least a second predetermined level while minimizing contaminating the molten mixture 241 and crystal 237. The sidewalls 231, 243 may be formed of copper, nickel, silver, a refractory metal (e.g., tungsten and/or molibdenum), and/ or other suitable materials. The melting point of the sidewalls 31, 41 is higher than the melting point of the materials provided to create the molten mixture 39. As an example, the materials may be selected to minimize an amount of copper included in the sidewalls 231, 243 to minimize copper contamination of the crystal 237. In one embodiment, the sidewalls 231, 243 include respective cores and outer layers. The outer layers may surround the cores. The cores include copper and the outer layers have less than a predetermined amount of copper or no copper. In another embodiment, an outer layer of the sidewall 231 and an inner layer of the sidewall 243 facing the molten mixture 241 and the crystal 237 have less than a predetermined amount of copper or no copper. In one embodiment, the bottom end 236 of the sidewall 231 extends below the sidewall 243. In another embodiment, the bottom end 236 of the sidewall 231 does not extend below the sidewall 243.

An upper inner portion 234 of the outer crucible 204 may be funnel-shaped to guide materials from the hoppers 236, 238. During operation, raw materials are supplied to the hoppers 236, 238 through inlet channels 240, 242 via valves 244, 246. As an example, the hopper 236 may receive a dopant powder (e.g., Boron) and the hopper 238 may receive granular polysilicon. The materials are dropped into an annular-shaped gap G between the outer crucible 204 and the inner crucible 206. The radial (or horizontal) width of the gap G varies vertically along the molten mixture 241 and the portion 239 due to the tapered sidewall 231. The materials are then melted from heat generated by the induction coils 218, 220 to provide the molten mixture 241, which cools to form a portion of the crystal prior to exiting the crucibles 204, 206. The outer induction coil 218 surrounds and/or is coiled around the outer crucible 204 and heats an outer circumferential portion of the supplied materials/molten mixture 241. The inner induction coil 220 heats an inner circumferential portion of the supplied materials/molten mixture 241. The induction coils 218, 220 may also heat an end portion of the crystal 237 nearest the crucibles 204, 206. The inner induction coil 220 may be controlled to control temperature distributions within the crystal 237 and create the solidification interface 245 between the molten mixture 241 and the crystal 237. The solidification interface 245 is flatter than if the inner induction coil 220 were not used.

The chamber 202 may further include a gas inlet 260, a gas outlet 262, and corresponding gas inlet (or supply) and gas outlet valves 264, 266 through which a supply gas, a purge gas, and other gases may pass. The chamber 202 may further include a first heater 270 in the first area 222 and heaters 272 in the second area 224. The heaters 272 are disposed in a row along the crystal 237 from a wall 274 separating the areas 222, 224 to a lower end of the chamber 202 and/or area 224. The heaters 272 may surround the crystal 237, a seed 280 and a crystal support member 282. The heater 270 is used to control a crystallization rate of the crystal 237. The heaters 270, 272 are used to control cooling of the crystal 237. Prior to forming the crystal 237, the seed 280 is placed on the crystal support member 282 and the crystal support member 282 is moved via a shaft 284 vertically to the crucibles 204, 206. As the crystal 237 is formed on the seed 280, the crystal support member 282 is pulled downward along the heaters 270, 272. Heat extraction below the crucibles 204, 206 is simplified because a ratio of a mass of the crystal 237 to a surface area of the solidification interface 245 is reduced as compared to a ratio of a mass of a traditional cylindrically-shaped ingot to a surface area of a corresponding solidification interface. The reduced ratio is associated with reduced intrinsic stresses in cast silicon ingots and improves yield of manufactured and machined components from the cast silicon ingots.

Figure 4:
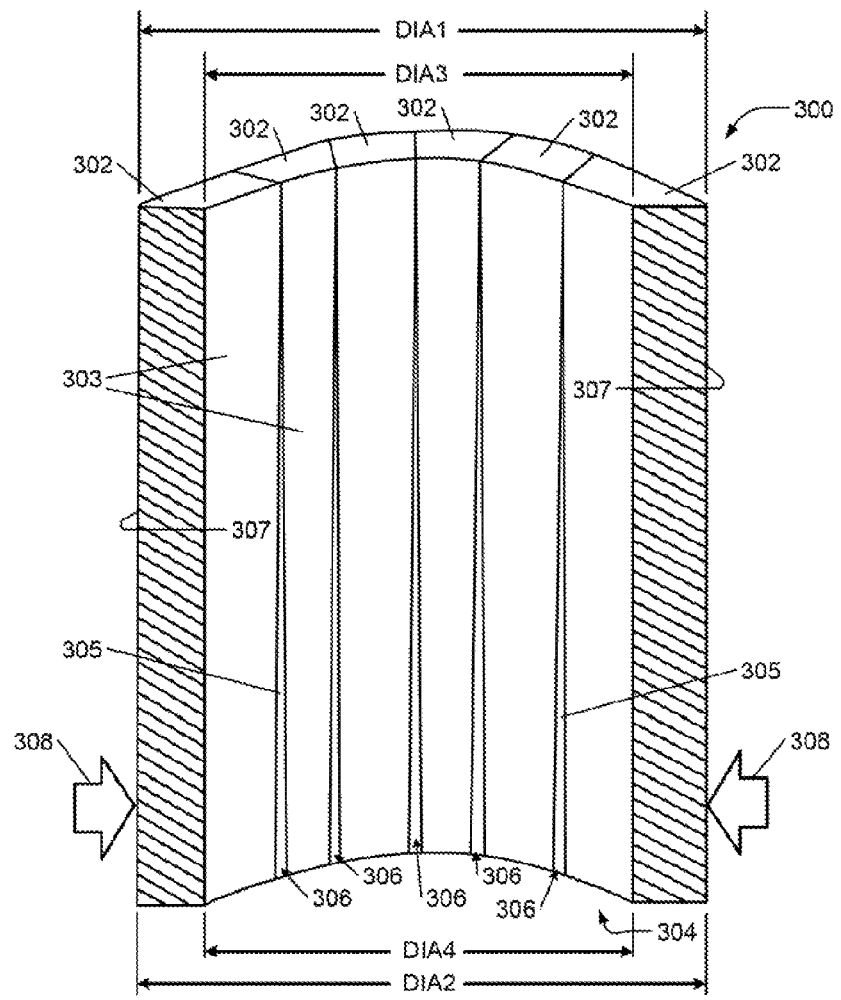
FIG. 4 is a perspective view of an example of an inner crucible in accordance with an embodiment of the present disclosure.

FIG. 4 shows an example of an inner crucible 300 that may replace the inner crucible 106 of FIG. 2. If the plates are not liquid cooled, the manifold 127 and supply and return lines 129 of FIG. 2 may be replaced with simply support members, similar to support members 126. The inner crucible 300 may extend below the outer crucible 104 of FIG. 2. The inner crucible 300 includes a set of plates 302 positioned along a circle, such that the plates 302 form a circular wall having an open bottom end 304. The plates 302 define one or more inner diameters. An upper outer diameter DIA1, a lower outer diameter DIA2, an upper inner diameter DIA3, and a lower inner diameter DIA4 are shown. In one embodiment, DIA 1 is equal to DIA2 and/or DIA3 is equal to DIA4. In another embodiment, DIA1 is not equal to DIA 2 and/or DIA 3 is not equal to DIA4. The plates 302 include inner surfaces 303, sides 305 and outer surfaces 307.

In yet another embodiment, the plates 302 are not spaced apart at a top portion of the inner crucible 300 and are spaced apart at a bottom portion of the inner crucible 300, as shown. Due to the spacing in the lower portion, there are gaps between the plates designated by arrows 306. The gaps 306 extend vertically between the plates 302 and provide the plates 302 with a degree of freedom to move radially inward during contraction of a tubular-shaped silicon ingot formed around the inner crucible 300. The plates 302 are separated at least at the bottom of the inner crucible 300 to allow them to deflect radially at the bottom of the inner crucible 300 and accommodate dimensional changes in the tubular-shaped silicon ingot, which happens as a result of the solidification and thermal contraction during ingot cooling. In another embodiment, the plates 302 are also spaced apart in the upper portion of the inner crucible 300, such that the gaps 306 extend from a bottom end of the inner crucible 300 to a top end of the inner crucible 300.

Molten mixture (e.g., the molten mixtures 39, 141, 241) cannot flow into the gaps 306. The gaps 306 are smaller than a predetermined size to prevent a molten mixture from passing between adjacent ones of the plates 302. Contraction of the tubular-shaped silicon ingot and radially inward movement of the plates 302 is represented by arrows 308. This allows the plates 302 to accommodate inner dimension changes of the tubular-shaped silicon ingot as a result of solidification and/or thermal contraction during ingot cooling. The ability of the plates 302 to move reduces friction between an inner crucible and the tubular-shaped silicon ingot, which prevents damage to the ingot. The plates 302 may be formed of the same or similar materials as the inner crucible 106 of FIG. 2.

Figure 5:
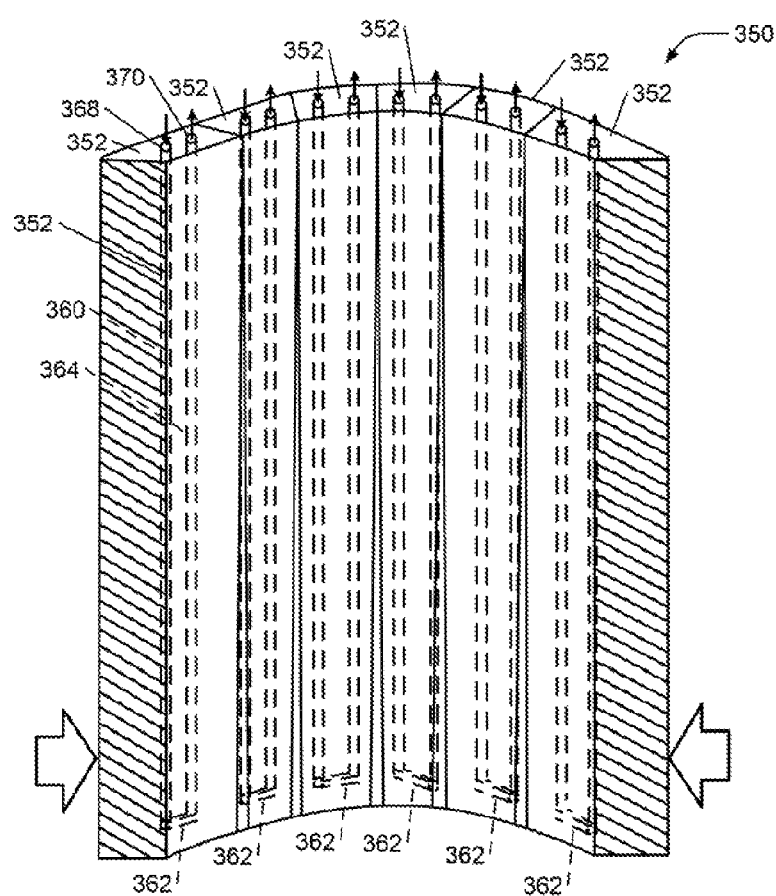
FIG. 5 is a perspective view of an example of an inner crucible including plates with cooling channels in accordance with an embodiment of the present disclosure.

FIG. 5 shows another example of an inner crucible 350 including plates 352 with cooling channels (one of which is designated 354). The cooling channels are used to cool the inner crucible 350 and extract heat from a silicon ingot. The cooling channels may be connected to supply and return lines (e.g., the supply and return lines 29, 129, 229 of FIGS. 1-3). The cooling channels are shown as 'U'-shaped channels, but may have other configurations. Although the cooling channels are shown as having uniform inner diameters and extending vertical lengths of the plates 352, the cooling channels may extend only a portion of the plates 352 and/or may have varying inner diameters/cross-sectional areas to provide more cooling near the bottom of the plates 352 than near the top of the plates 352. In one embodiment, the cooling channels are configured to gradually provide more cooling from the top of the plates 352 to the bottom of the plates 352, such that maximum cooling is provided at the bottom of the plates 352.

The plates 352 may be configured similarly as the plates 302 of FIG. 4, but in the embodiment of FIG. 5 include the cooling channels. As an example, the cooling channels include respectively vertical disposed inlet channels (one of which is designated 360), horizontally disposed intermediate channels 362 and vertically disposed outlet channels (one of which is designated 364). The inlet channels 360 include inlets (one of which is designated 368. The outlet channels 364 include outlets (one of which is designated 370).

In one embodiment, the cooling channels are connected in series, such that the plates 352 of the inner crucible 350 collectively include only a single input and a single output for receiving and outputting a coolant. In another embodiment, the cooling channels of the plates 352 are connected to provide sets of plates 352, where each of the sets includes two or more of the plates 352 connected in series. In another embodiment, cooling channels of two or more of the plates 352 are connected in parallel, such that two or more of the plates 352 receive coolant from a coolant source during a same period of time. The coolant source may include a coolant reservoir and one or more coolant pumps, examples of which are shown in FIG. 6. In one embodiment, the plates 352 are electrically isolated from each other by a dielectric material placed on the surfaces of mechanical contact between the plates.

FIG. 6 shows a portion of an ingot casting system including a control system 400. The control system 400 may be included in the ingot casting systems of FIGS. 1-3 and used to control operations of the furnaces 10, 100, 200. The control system 400 may include sensors (e.g., pressure sensors 402, temperature sensors 404, and a position sensor 406) and a control module 408. The pressure sensors 402 may be used to detect pressures in the lines 60, 62, 160, 162, 260, 262 and/or in the areas 22, 24, 122, 124, 222, 224. The temperature sensors 404 may include a pyrometer 410 for detecting a temperature of a seed (e.g., one of the seeds 80, 180, 280) and/or a crystal being formed (e.g., one of the crystal 37, 137, 237). The temperature sensors 404 may include other temperature sensors 412 to detect, for example, temperatures of the crucibles 14, 16, 104, 106, 204, 206. The other temperature sensors 412 may be used to detect temperatures in the lines 60, 62, 160, 162, 260, 262 and/or in the areas 22, 24, 122, 124, 222, 224.

The control module 408 may include a pressure module 420, a temperature module 422, a silicon module 424, a dopant module 426, an induction module 428, a pull rate module 430 and a cooling module 432. The pressure module 420 may determine pressures within the chambers 12, 102, 202 and areas 22, 24, 122, 124, 222, 224 based on pressure signals from the pressure sensors 402. The pressure module 420 may control supply and discharge of gases into and out of the chambers 12, 102, 202. This may include controlling state of a gas pump 440, which supplies gas from a gas source 442 to a gas supply valve 444 (e.g., one of the valves 64, 164, 264). The temperature module 422 may determine temperatures within the chambers 12, 102, 202 and elements therein based on temperatures signals from the temperature sensors 404.

The modules 424, 426, 428, 430 and 432 may operate based on the parameters determined by the pressure module 420 and the temperature module 422. The silicon module 424 may control supply of granular silicon into a hopper via a silicon supply feeder 450. The granular silicon may be fed from a silicon source 452 through the silicon supply feeder 450. If gravity fed, the silicon supply feeder 450 may simply include a silicon supply valve (e.g., one of the valves 46, 146, 246). A supply sensor 454 may be included in the silicon supply feeder 450 or in the silicon source 452 and indicate whether silicon is being supplied to and/or through the silicon supply feeder 450 and/or to a mold.

The dopant module 426 may control supply of dopant into a hopper via a dopant supply feeder 460. The dopant may be fed from a dopant source 462 through the dopant supply feeder 460. If gravity fed, the dopant supply feeder 460 may simply include a dopant supply valve (e.g., one of the valves 44, 144, 244). A supply sensor 464 may be included in the dopant supply feeder 460 or in the dopant source 462 and indicate whether dopant is being supplied to and/or through the dopant supply feeder 460 and/or to a mold.

The induction module 428 controls operation of induction coils 470 (e.g., the induction coils 18, 20, 118, 120, 218, 220). The induction module 428 may receive power from and/or control power to the induction coils 470. A power source 472 is shown for supplying power to the control module 408 and the induction coils 470. The pull rate module 430 controls a pull rate of a shaft (e.g., one of the shafts 84, 184, 284) of a crystal support member. This may include controlling power to a crystal support member motor 474.

The cooling module 432 may include a heater module 480 and a coolant module 482. The heater module 480 controls power to heaters 484 (e.g., the heaters 70, 72, 170, 172, 270,

272). The heaters 484 may include graphite heating elements. The coolant module 482 controls temperature and flow rate of coolant to plates of an inner crucible (e.g., one of the inner crucibles 16, 106, 206). Although coolant is described herein as being provided to an inner crucible, coolant may also be provided to an outer crucible, which may include coolant channels. The coolant module 482 controls a chiller 485 of a coolant reservoir 486, a coolant pump 488 and coolant valves 490 to control the temperature and flow rate. The control system 400 may further include an output valve 492 (e.g., one of the gas outlet valves 66, 166, 266), which is controlled by the control module 408.

Figure 7:
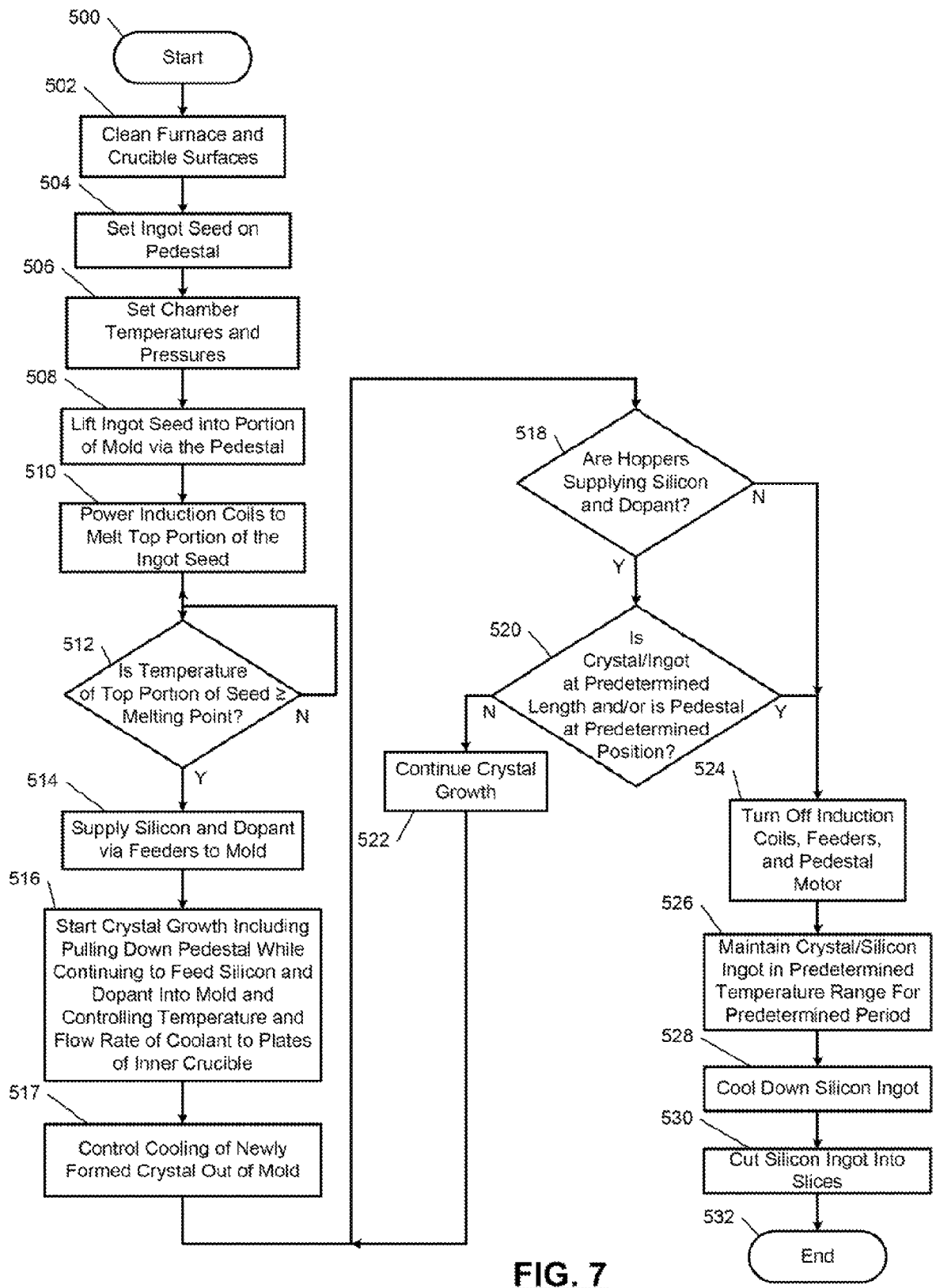
FIG. 7 illustrates an example method of forming a tubular-shaped silicon ingot in accordance with an embodiment of the present disclosure.

The systems disclosed herein may be operated using numerous methods, an example method is illustrated in FIG. 7. FIG. 7 shows a method of forming a tubular-shaped silicon ingot. Although the following operations are primarily described with respect to the implementations of FIGS. 1-6, the operations may be modified to apply to other implementations of the present disclosure. The operations may be iteratively performed. The method may begin at 500. At 502, furnace and crucible surfaces are cleaned. At 504, an ingot seed is set on a crystal support member (e.g., one of the crystal support members 82, 182, 282), which may be referred to as a pedestal.

At 506, the modules 420, 422 set pressures and/or temperatures of a chamber (e.g., one of the chambers 12, 102, 202). This may include setting temperatures of elements (e.g., an inner crucible, an outer crucible, a seed, etc.). At 508, the pull rate module 430 lifts via the crystal support member the seed, such that a first portion of the seed is in a portion of a mold between an outer crucible and an inner crucible or against a bottom of the mold. Operation 508 may be performed while performing operation 506.

At 510, induction module 428 powers induction coils (e.g., the induction coils 18, 20, 118, 120, 218, 220) to melt a top portion of the seed. Power is supplied to the induction coils, such that the first portion of the seed is heated in a controlled manner and until the top portion is melted. The top portion is part of the first portion of the seed.

At 512, the temperature module 422 determines whether a temperature of the top portion is at or above a melting point. This is accomplished by detecting a temperature of the seed via the pyrometer 410. In one embodiment, the temperature of the top portion is estimated based on a detected temperature of a bottom portion of the seed via the pyrometer 410. If the top portion is greater than or equal to the melting point, than operation 514 is performed.

At 514, the silicon module 424 and the dopant module 426 supply silicon and dopant to hoppers (e.g., the hoppers 36, 38, 136, 138, 2236, 238) via the feeders 450, 460. The amount of dopant supplied is proportional to the amount of silicon supplied. At 516, crystal growth is started including the pull rate module 430 pulling down the crystal support member while the modules 424, 426 continue to feed silicon and dopant into the mold. The silicon and dopant are supplied in a controlled manner and the pull rate is controlled, such that the solidification interface between a molten mixture and solidified silicon remains at about a same vertical position relative to the mold while the seed is pulled away from the mold. Granular silicon is fed into the mold and heated in controlled manner via induction coils to reduce friction between walls of the crucibles and formed crystal (or cast ingot). Reducing friction between the walls of the crucibles and the crystal prevents mechanical damage and contamination of the crystal. Operation 516 may also include controlling temperature and flow rate of coolant to plates of inner crucible, as described above.

At 517, the heater module 480 controls a cooling rate of newly formed crystal out of the mold by controlling, for example, amount of current to heaters 484. At 518, the control module 408 determines whether silicon and dopant are continuing to be supplied to the mold via the hoppers. This may be based on signals from the sensors 454, 464. If silicon and dopant are being provided, operation 520 is performed, otherwise operation 524 is performed.

At 520, the control module 408 determines whether a length of the silicon ingot is a predetermined length (e.g., 1-20 meters) and/or if the crystal support member is at a predetermined position away from the mold. This may be determined based on a signal from the position sensor 406, which indicates a position of the crystal support member. The position of the crystal support member is directly related to a length of the silicon ingot. If the silicon ingot is the predetermined length and/or the crystal support member is at the predetermined position, then operation 524 is performed, crystal growth continues at 522. Operations 518, 520 and 522 may be continually performed until results of operations 518 and/or 520 cause operation 524 to be performed.

At 524, the induction module 428 turns off power to the induction coils 470. The modules 424, 426 turn off the feeders 450, 460 and/or close corresponding valves. The pull rate module 430 stops moving the seed/silicon ingot.

At 526, the heater module 480 maintains the silicon ingot at a high temperature (e.g., 1100-1300° C.) or in predetermined temperature range for a predetermined period of time (e.g., 0.5-6 hours). This aids in annealing residual stresses in the silicon ingot and preventing cracking during subsequent machining of the silicon ingot. At 528, the heater module 480 decreases current to the heaters 484 to cool down the silicon ingot.

At 530, the silicon ingot is removed from the furnace and is sliced and/or machined. This may include cutting the silicon ingot into slices having a predetermined width (e.g., 300-600 millimeters) and/or machining the silicon ingot and/or the slices to provide component rings. The silicon ingot may be sliced using a wire saw or band saw. The method may end at 532.

The above-described operations are meant to be illustrative examples; the operations may be performed sequentially, synchronously, simultaneously, continuously, during overlapping time periods or in a different order depending upon the application. Also, any of the operations may not be performed or skipped depending on the implementation and/or sequence of events.

In addition to the differences disclosed above with regards to granular structures of components machined from tubular-shaped (or hollow) silicon ingots using a mold having inner and outer crucibles and components machined from a solid ingot block using only an outer crucible, additional differences are described below with respect to FIGS. 8-9. As described above, uniformity of grain structures of the tubular-shaped silicon ingot is based on the heating of the granular silicon in the mold via the inner and outer induction coils, as well as the controlled cooling via the stated heaters.

Figure 8:
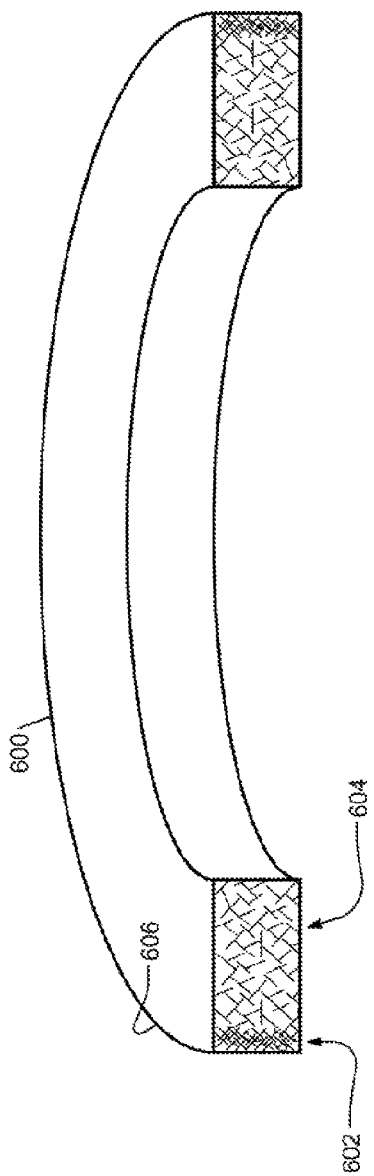
FIG. 8 is a cross-sectional perspective view of an example of a ring formed from machining a solid silicon ingot block.

FIG. 8 shows an example of a granular structure provided by use of a mold having only an outer crucible and machining a ring 600 from a solid silicon ingot block. FIG. 8 is illustrative of differences in granular structures between (i) an outer portion 602 of the ring 600 near the outer crucible and (ii) a remainder 604 of the ring 600 radially inward of the outer portion. FIG. 8 is not illustrative of the uniformity of the granular structure of the ring 600 provided during formation of the solid silicon ingot block using the outer crucible. As can be seen, the outer portion 602 has a near-surface-like (or small/fine) grain structure near the radially outer surface 606 of the ring 600. The remainder 604 of the ring 600 has a grain structure that is larger and coarser than the near-surface-like grain structure. This is due to only the outer surface 606 being near the outer crucible.

Figure 9:
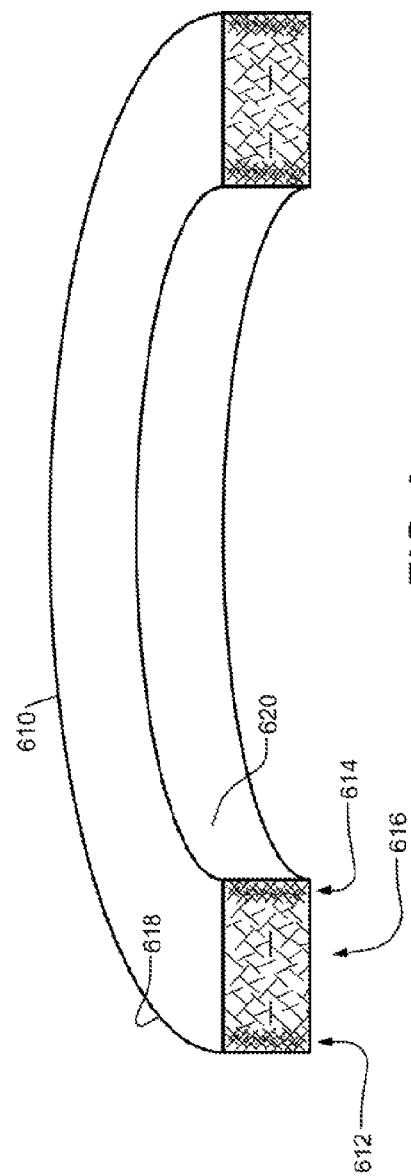
FIG. 9 is a cross-sectional perspective view of an example of a ring machined from a tubular-shaped silicon ingot provided in accordance with an embodiment of the present disclosure.

FIG. 9 shows an example of a granular structure provided by use of a mold having outer and inner crucibles and machining a ring 610 from a tubular-shaped silicon ingot formed using the molds disclosed herein. FIG. 9 is illustrative of differences in granular structures between (i) outer and inner portions 612, 614 of the ring 610 near the outer and inner crucibles and (ii) a remainder 616 of the ring 610 between the outer and inner portions 612, 614. FIG. 9 is not illustrative of the uniformity of the granular structure of the ring 610 provided during formation of the tubular-shaped silicon ingot using the outer and inner crucibles. As can be seen, the outer and inner portions 612, 614 have near-surface-like (or small/fine) grain structures near the radially outer surface 618 and the radially inner surface 620 of the ring 610. The remainder 616 of the ring 610 has a grain structure that is larger and coarser than the near-surface-like grain structure. This is due to the outer and inner surfaces 618, 620 being near the outer and inner crucibles. The differences illustrated between the examples of FIGS. 8-9 are especially true for polycrystalline silicon.

The above-described examples include material shaping to grow silicon ingots in the shape of tubes. This type of near-net-shape provides an economical usage of raw materials for manufacturing equipment components and parts having the shape of rings. The examples include using electromagnetic casting furnaces to cast silicon tubes having respective inner channels as opposed to bulk cylindrically-shaped ingots that do not have inner channels. This improves uniformity of grain structures of formed silicon tubes and reduces ingot surface damage and contamination with impurities.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise EMC processing equipment, including a processing tool or tools, chamber or chambers, a platform or platforms for processing, and/or specific processing components. These systems may be integrated with electronics for controlling their operation before, during, and after silicon ingot formation. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, frequency settings, flow rate settings, fluid delivery settings, positional and operation settings, and transfer tool settings, etc.

Broadly speaking, the controller may be defined as electronics having various integrated circuits, logic, memory, and/or software that receive instructions, issue instructions, control operation, enable cleaning operations, enable endpoint measurements, and the like.

The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process in a system.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

What is claimed is:

1. A furnace for electromagnetic casting a tubular-shaped silicon ingot, the furnace comprising:
   a mold comprising an outer crucible and an inner crucible, wherein the outer crucible is annular-shaped, wherein the inner crucible is disposed in the outer crucible and spaced away from the outer crucible to provide a gap between the inner crucible and the outer crucible, wherein the mold is configured to receive granular silicon in the gap, and
   wherein
      the inner crucible comprises a plurality of plates, the plurality of plates are
         disposed to provide a tubular-shaped structure,
         not spaced apart at a top of the tubular-shaped structure,
         spaced apart at a bottom of the tubular-shaped structure such that gaps exist between adjacent ones of the plurality of plates at the bottom of the tubular-shaped structure, and
         disconnected distinct plates that are able to move relative to each other;
   an outer induction coil disposed around the outer crucible;
   an inner induction coil disposed in the inner crucible, wherein the outer induction coil and the inner induction coil are configured to heat and melt the granular silicon in the mold to form the tubular-shaped silicon ingot; and
   a support member configured to hold and move a seed relative to the mold during formation of the tubular-shaped silicon ingot on the seed.

2. The furnace of claim 1, further comprising a plurality of heaters configured to heat the tubular-shaped silicon ingot subsequent to being pulled from the mold.

3. The furnace of claim 1, further comprising:
   a plurality of hoppers; and
   a plurality of feeders supplying the granular silicon and a dopant to the plurality of hoppers,
   wherein
      the plurality of hoppers guide the granular silicon and the dopant into the gap in the mold, and
      the outer crucible is funnel-shaped to guide the granular silicon and the dopant from the hoppers into the gap in the mold.

4. The furnace of claim 1, wherein the plurality of plates are placed in a circle to provide a circular side wall.

5. The furnace of claim 4, wherein the plurality of plates are spaced apart to allow the plates to deflect while experiencing contraction forces on the plates by the tubular-shaped silicon ingot during cooling of the tubular-shaped silicon ingot.

6. The furnace of claim 4, wherein the plurality of plates comprise coolant channels configured to receive a coolant to cool the inner crucible.

7. The furnace of claim 1, wherein the inner crucible has a closed bottom end.

8. The furnace of claim 1, wherein the inner crucible has an open bottom end.

9. The furnace of claim 1, wherein the inner crucible extends below a bottom of the outer crucible.

10. The furnace of claim 1, wherein a sidewall of the inner crucible is tapered, such that a lower outer diameter of the inner crucible is less than an upper outer diameter of the inner crucible.

11. An electromagnetic casting system comprising:
    the furnace of claim 1;
    at least one sensor for detecting at least one parameter of the furnace; and
    a control module configured to, based on the at least one parameter, control a pull rate of the support member away from the mold.

12. The electromagnetic casting system of claim 11, wherein the control module is configured to, based on the at least one parameter, control (i) flow of the granular silicon into the mold, and (ii) current to the outer induction coil and the inner induction coil.

13. A mold for forming a tubular-shaped silicon ingot, the mold comprising:
    an outer crucible, wherein the outer crucible is annular-shaped; and
    an inner crucible disposed in the outer crucible, such that the outer crucible surrounds the inner crucible, wherein a gap exists between the outer crucible and the inner crucible, wherein the outer crucible and the inner crucible are configured to receive granular silicon in the gap,
    wherein the inner crucible comprises a plurality of plates, wherein the plurality of plates comprise inner surfaces, sides, and outer surfaces, wherein the inner surfaces face each other and are disposed along an inner circular perimeter, wherein the plurality of plates are disposed to provide a tubular-shaped structure and are disconnected distinct plates that are able to move relative to each other, and
    wherein the plurality of plates are disposed, such that the plurality of plates are not spaced apart at a top of the tubular-shaped structure and are spaced apart at a bottom of the tubular-shaped structure such that gaps exist between adjacent ones of the plurality of plates at the bottom of the tubular-shaped structure for displacement of the plurality of plates radially inward while experiencing contraction forces of the tubular-shaped silicon ingot on the outer surfaces during solidification of the tubular-shaped silicon ingot.

14. The mold of claim 13, wherein the outer surfaces are disposed along an outer circular perimeter of the inner crucible.

15. The mold of claim 13, wherein the gaps between the plurality of plates exist for a bottom portion of the inner crucible and do not exist for an upper portion of the inner crucible.

16. The mold of claim 13, wherein the inner crucible has a closed bottom end.

17. The mold of claim 13, wherein the inner crucible has an open bottom end.

18. The mold of claim 13, wherein the inner crucible extends below a bottom of the outer crucible.

19. The mold of claim 13, wherein the inner crucible comprises coolant channels for receiving a coolant to cool the inner crucible.

20. An electromagnetic casting system comprising:
    the mold of claim 19;
    a first sensor for detecting a first parameter of the mold; and
    a control module configured to, based on the first parameter, control temperature and flow of coolant to the inner crucible.

21. The electromagnetic casting system of claim 20, further comprising:
- an outer induction coil surrounding the outer crucible;
- an inner induction coil disposed in the inner crucible;
- a support member configured to hold a seed; and
- a second sensor configured to detect a second parameter,
- wherein the control module is configured to, based on the first parameter and the second parameter, control (i) a pull rate of the support member away from the mold, (ii) flow of the granular silicon into the mold, and (ii) current to the outer induction coil and the inner induction coil.

22. The furnace of claim 1, wherein the plurality of plates are separated to allow the plurality of plates to deflect radially.

23. The furnace of claim 1, wherein widths of gaps between the adjacent ones of the plurality of plates increases from tops of the plurality of plates to bottoms of the plurality of the plates.

24. The mold of claim 13, wherein the plurality of plates are separated to allow the plurality of plates to deflect radially.

25. The mold of claim 13, wherein widths of gaps between the adjacent ones of the plurality of plates increases from tops of the plurality of plates to bottoms of the plurality of the plates.

* * * * *